US008939028B2

(12) United States Patent
Ausserlechner

(10) Patent No.: US 8,939,028 B2
(45) Date of Patent: Jan. 27, 2015

(54) INTEGRATED SENSORS AND SENSING METHODS

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 292 days.

(21) Appl. No.: 13/468,734

(22) Filed: May 10, 2012

(65) Prior Publication Data

US 2013/0298669 A1   Nov. 14, 2013

(51) Int. Cl.
*G01P 15/11* (2006.01)
*G01R 33/02* (2006.01)

(52) U.S. Cl.
USPC ........................................ 73/514.31; 324/252

(58) Field of Classification Search
USPC ............... 73/493, 514.31; 324/207.2, 207.13, 324/207.25, 244, 252
See application file for complete search history.

(56) References Cited

U.S. PATENT DOCUMENTS

| 6,191,579 | B1 * | 2/2001 | Striker ...................... 324/207.25 |
| 6,545,462 | B2 * | 4/2003 | Schott et al. ............... 324/207.2 |
| 6,937,012 | B2 * | 8/2005 | Saito .............................. 324/251 |
| 7,119,538 | B2 * | 10/2006 | Blossfeld ...................... 324/251 |
| 7,235,968 | B2 * | 6/2007 | Popovic et al. ............... 324/247 |
| 7,290,448 | B2 * | 11/2007 | Shirasaka et al. ............... 73/493 |
| 7,444,872 | B2 * | 11/2008 | Shoji ............................. 73/514.31 |
| 7,474,093 | B2 * | 1/2009 | Ausserlechner ............... 324/244 |
| 7,829,982 | B2 * | 11/2010 | Shirasaka et al. ............. 257/666 |
| 7,956,604 | B2 * | 6/2011 | Ausserlechner ......... 324/207.21 |
| 8,102,172 | B2 * | 1/2012 | Takeya et al. ............ 324/207.21 |
| 8,222,889 | B2 * | 7/2012 | Oberhoffner ............ 324/207.13 |
| 8,269,486 | B2 * | 9/2012 | Hammerschmidt et al. ......................... 324/207.21 |
| 8,664,945 | B2 * | 3/2014 | Laville et al. ............... 324/207.2 |
| 2002/0008513 | A1 * | 1/2002 | Hiligsmann et al. .......... 324/251 |
| 2009/0146647 | A1 * | 6/2009 | Ausserlechner ......... 324/207.21 |
| 2010/0060263 | A1 * | 3/2010 | Granig et al. ................. 324/202 |
| 2012/0161755 | A1 | 6/2012 | Masson et al. |
| 2012/0217960 | A1 * | 8/2012 | Ausserlechner ............... 324/252 |
| 2013/0127455 | A1 * | 5/2013 | Ettelt et al. .................... 324/252 |
| 2013/0253864 | A1 * | 9/2013 | Fujita et al. ..................... 702/65 |
| 2014/0028307 | A1 | 1/2014 | Ausserlechner |

FOREIGN PATENT DOCUMENTS

| EP | 1864086 B1 | 12/2007 |
| WO | WO 2009/062958 A2 | 5/2009 |

OTHER PUBLICATIONS

Haeberli et al., *Contactless Angle Measurement Using Four Hall Devices on Single Chip*, IEEE © 1997, pp. 385-388.
Application and File History for U.S. Appl. No. 13/944,391, filed Jul. 17, 2013, inventor Ausserlechner.
Specification (including claims and abstract), Drawings and Filing Receipt for U.S. Appl. No. 13/944,410, filed Jul. 17, 2013, inventor Ausserlechner.

* cited by examiner

*Primary Examiner* — Helen Kwok
(74) *Attorney, Agent, or Firm* — Patterson Thuente Pedersen, P.A.

(57) ABSTRACT

Embodiments relate to integrated sensors and sensing methods. Embodiments relate to integrated sensor layouts. Embodiments are configured to maximize a ratio of sensor spacing over a die area. While being generally applicable to many different types of sensors, particular advantages can be presented for magnetoresistive (xMR) sensors.

27 Claims, 5 Drawing Sheets

Signal of the GMR-bridge at small airgap and large size of magnetic segments

INTEGRATED SENSORS AND SENSING METHODS

TECHNICAL FIELD

The invention relates generally to sensors and more particularly to differential magnetic field sensors.

BACKGROUND

Integrated sensors typically combine sensor elements and related circuitry, such as for signal supply and/or conditioning, on the same substrate. Some integrated sensors face a significant challenge: maintaining a necessary spacing between sensing elements for detecting a spatial change in a quantity to be measured while substrate sizes shrink. Examples of differential sensors include magnetic speed sensors, differential magnetic field sensors and position sensors, among others.

Conventional solutions often rely on outdated or obsolete technologies, or use larger die sizes even though they are more expensive to manufacture. Still others avoid integration by arranging sensor elements and related circuitry on separate dies, which is more expensive and less reliable because of the additional interfaces and bond wires needed for coupling.

Therefore, there is a need for improved integrated sensors.

SUMMARY

Embodiments relate to integrated sensors and sensing methods. In an embodiment, a sensor comprises a substrate having a length axis, a width axis and a diagonal axis in a plane defining a surface, the diagonal axis being longer than the length axis and the width axis; signal conditioning circuitry arranged on the surface of the substrate; and at least two sensor elements coupled to the signal conditioning circuitry and arranged on the substrate spaced apart from one another along the diagonal axis, the sensor configured to determine a difference in a characteristic sensed at a first of the at least two sensor elements and at a second of the at least two sensor elements.

In an embodiment, a sensor comprises a substrate having four corners defining a surface having a length axis, a width axis and a diagonal axis, the diagonal axis being longer than the length axis and the width axis; signal conditioning circuitry arranged on the surface of the substrate; and at least two sensor elements coupled to the signal conditioning circuitry arranged on the substrate spaced apart from one another by at least two-thirds of the length axis and two-thirds of the width axis, the sensor configured to determine a difference in a characteristic sensed at a first of the at least two sensor elements and at a second of the at least two sensor elements.

In an embodiment, a method comprises providing a substrate having four corners defining a surface having a length and a width; arranging on the substrate signal conditioning circuitry; and arranging on substrate at least two sensor elements spaced apart from one another by at least two-thirds of the length and two-thirds of the width; sensing a characteristic at a first of the at least two sensor elements and at a second of the at least two sensor elements; and determining a difference in the characteristic sensed at the first and second of the at least two sensor elements.

In an embodiment, a speed sensor system comprises a magnetic target wheel; and a sensor comprising at least two sensor elements arranged proximate a diagonal dimension of a die also having length and width dimensions being less than the diagonal dimension, the sensor further comprising a package in which the die is arranged, the sensor arranged such that a direction of rotation of the target wheel is substantially aligned with the diagonal dimension of the die.

BRIEF DESCRIPTION OF THE DRAWINGS

The invention may be more completely understood in consideration of the following detailed description of various embodiments of the invention in connection with the accompanying drawings, in which.

Figure 1:
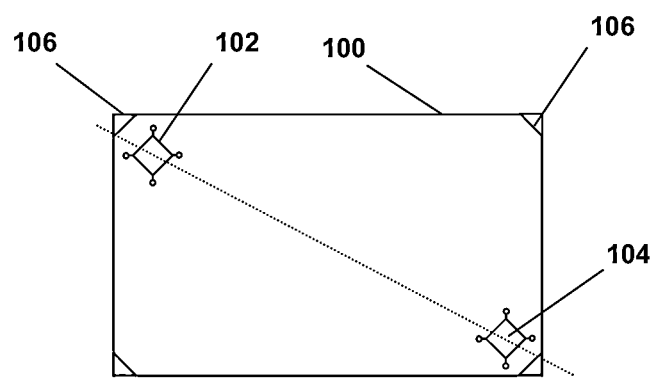
FIG. 1 depicts a substrate and sensor elements according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to integrated sensor layouts. Embodiments are configured to maximize a ratio of sensor spacing over a die area. While being generally applicable to many different types of sensors, particular advantages can be presented for magnetoresistive (xMR) sensors.

Referring to FIG. 1, a sensor substrate or die 100 is depicted. In embodiments, die 100 is rectangular, square or some other shape. Die 100 can comprise a semiconductor substrate, a silicon semiconductor substrate, a 100-silicon semiconductor substrate with or without CMOS technology, including with feature size less than about 2 μm, or some other substrate or die type in embodiments.

Two sensor elements 102 and 104 are arranged on sensor die 100. Sensor elements 102 and 104 can comprise many different types of sensor elements configured to sense physical characteristics, including differential sensor elements for sensing scalar characteristics like temperature or hydrostatic pressure, or vector fields like magnetic, electric or acceleration, at the location of each of sensor elements 102 and 104 and then determining a difference therebetween. For example, sensor elements 102 and 104 can comprise Hall effect elements, including Hall plates or vertical Hall devices, MAG-FETs, magnetoresistors (xMR) such as GMRs, AMRs, TMRs or CMRs, among others. Other sensor types are also possible in various embodiments.

In an embodiment, sensor elements 102 and 104 are arranged along the longest axis of sensor die 100, such as on or near the diagonal axis of die 100 as depicted. In the embodiment of FIG. 1, the effective magnetic centers of sensor elements 102 and 104 do not align precisely with the diagonal axis of die 100, in part because sensor elements 102 and 104 are square while die 100 is diagonal and also because the very corners 106 of die 100 generally are not suitable for placement of sensor elements 102 and 104 because of the high mechanical stress and other factors.

Figure 2:
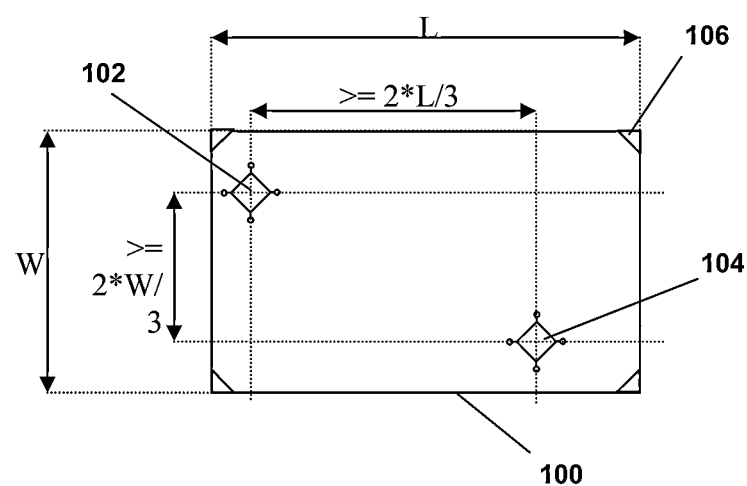
FIG. 2 depicts a substrate and sensor elements according to an embodiment.

Therefore, in embodiments and referring also to FIG. 2, sensor elements 102 and 104 are arranged such that they are spaced apart by at least two thirds of the length of die 100 in the length dimension. At the same time, sensor elements 102 and 104 are spaced apart by at least two thirds of the width of die 100 in the width dimension.

Alternatively, in embodiments it can be assumed that spacing in the length dimension is at least x*L, and the spacing in the width dimension is at x*W. Then, an aim is to achieve a spacing, s, of s>L with s<=sqrt((x*L)^2+(x*W)^2)=x*sqrt(L^2+L^2/R^2)=x*sqrt(A*R+A/R), with the area A=W*L and the aspect ratio R=L/W. In other words, in embodiments sensor elements 102 and 104 are arranged on or near the diagonal dimension, or spaced apart in a generally diagonal manner with respect to the length and width dimensions of die 100, such that s>L, or at least more similar to the length dimension than the width dimension where the length dimension is greater than the width dimension.

Figure 3:
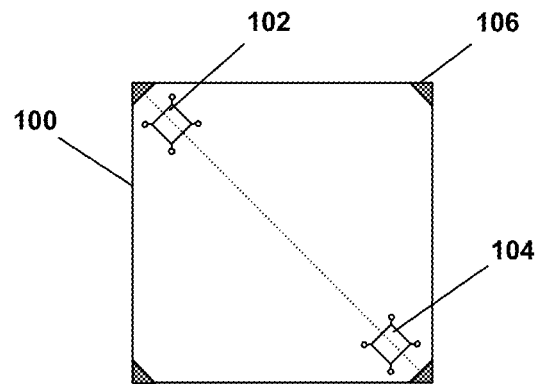
FIG. 3 depicts a substrate and sensor elements according to an embodiment.

In embodiments, and referring to FIG. 3, die 100 is also as close to square as possible. Such an arrangement, where L=W, maximizes the ratio of sensor spacing over substrate area, or $$\mathrm{sqrt}(L^2+W^2)/(L*W)$$

Figure 4A:
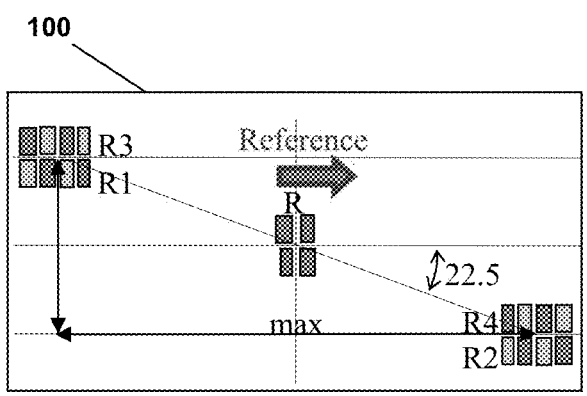
FIG. 4A depicts a substrate and sensor elements according to an embodiment.

In embodiments, and referring to FIG. 4, sensor elements 102 and 104 comprise xMR sensor elements, such as GMRs. GMRs have a magnetic reference layer that is premagnetized with a certain direction during fabrication. The most efficient way to premagnetize GMRs is to magnetize all of the devices on a wafer in a single step. It would be much more expensive and time-consuming to premagnetize each GMR element separately. A single-step process, however, can establish only a single direction of premagnetization for all of the GMR elements on the die.

Figure 4B:
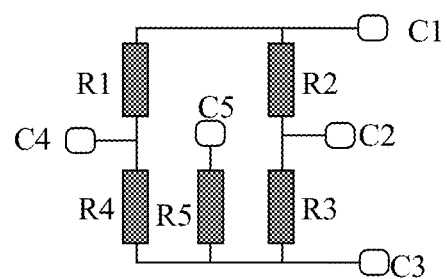
FIG. 4B depicts a sensor element bridge configuration according to an embodiment.

In an embodiment, the premagnetization of GMR elements Rn is aligned along the length axis die 100, wherein die 100 has a length axis, a width axis and a diagonal axis. Four GMR resistors R1, R2, R3 and R4 form a first bridge, as depicted in FIG. 4B. Two resistors R1 and R3 are located near the upper left corner of die 100, and two resistor R2 and R4 are located in lower right corner (with respect only to the orientation of die 100 on the drawing page). The spacing in the length, or horizontal to the page, direction is maximized, i.e., the GMR resistors are located as close to the left and right edges of the substrate as possible, in accordance with the discussion herein above. In the width direction, or vertical in the drawing plane of the page, the resistors are spaced apart by a distance such that a diagonal straight line between the effective magnetic centers of the resistors is tilted by about 22.5 degrees with respect to the length axis in an embodiment and thus also to the direction of premagnetization. In other embodiments, the angle can vary. For example, in another embodiment the angle can be about 45 degrees.

Figure 5:
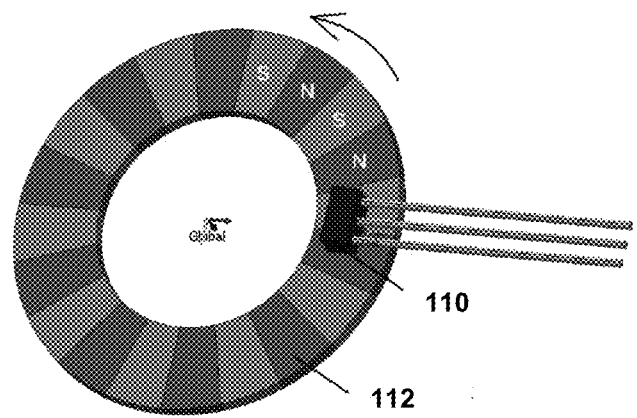
FIG. 5 depicts a sensor and pole wheel configuration according to an embodiment.

Referring to FIG. 5, die 100 can be mounted in a sensor package 110, and in an embodiment GMR resistors R1 and R3 are arranged on a different reading radius than GMR resistors R2 and R4 given their layouts as depicted in FIG. 4. In embodiments, this can reduce the overall performance of the sensor because the pole wheel 112 is designed for an optimum reading radius, and any deviation therefrom can reduce the useful magnetic field components in a direction tangential to the wheel and increase unwanted components in a radial direction.

Figure 6:
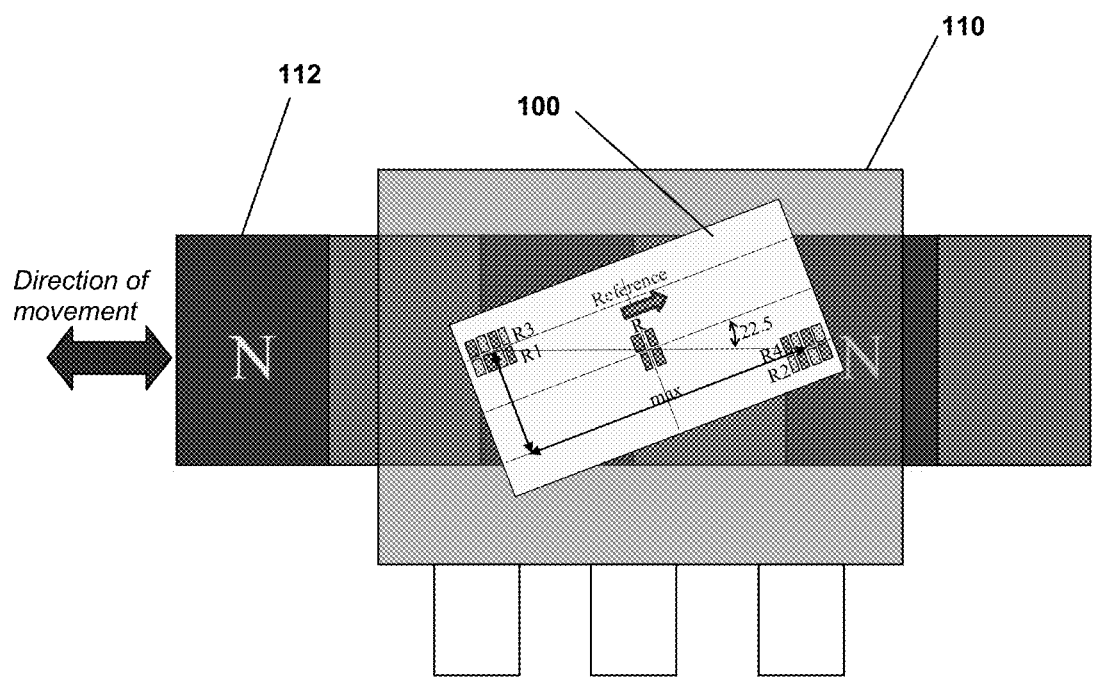
FIG. 6 depicts a sensor and pole wheel configuration according to an embodiment.

In embodiments, however, die 100 can be arranged in sensor package 110 in an unconventional way to avoid the aforementioned negative performance effects. Referring to FIG. 6, die 100 can be rotated within package 100 such that the diagonal axis between R1, R3 and R2, R4 is substantially parallel to the direction of movement of pole wheel 112, and the angle between the premagnetization direction and the direction of movement of pole wheel 112 is about 22.5 degrees in an embodiment, though as previously mentioned this angle can vary in other embodiments. At small air gaps, the distance between the sensor elements Rn and pole wheel 112, and large pole wheel segments, the range of linearity of the GMRs also can be extended.

Figure 7A:
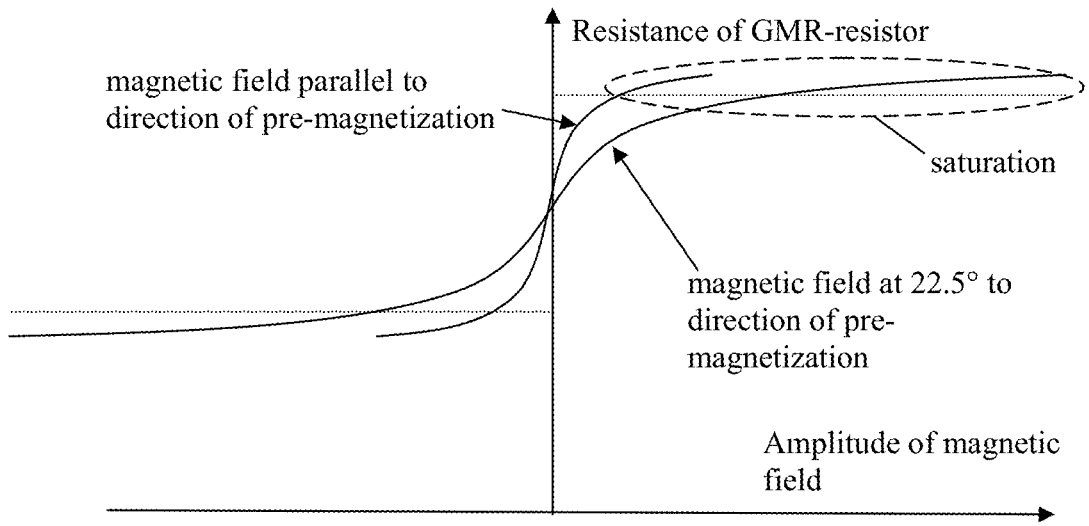
FIG. 7A is a plot of resistance versus magnetic field amplitude according to an embodiment.
Figure 7B:
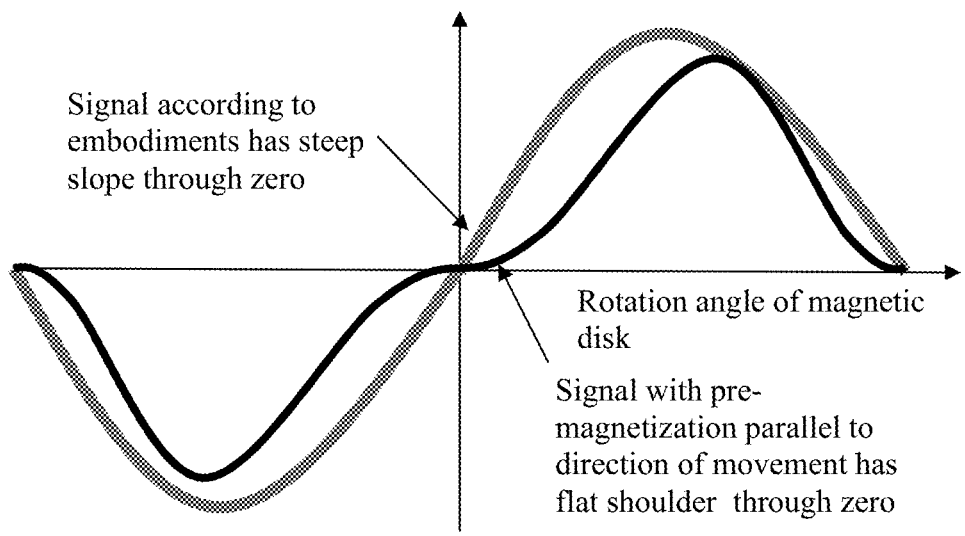
FIG. 7B is a plot of a GMR bridge signal according to an embodiment.

Refer also to FIG. 7, given the rotated arrangement of die 100 in package 110, the saturation of the GMR resistors is reduced (FIG. 7A) while at the same time the spacing of the sensor elements is maximized with respect to the fixed die area, which reduces the tendency of the signals to show flat shoulders through the zero crossings (FIG. 7B). Moreover, the shoulders are flatter with larger fields and a larger ratio of pole size over spacing of the sensor elements.

Figure 8A:
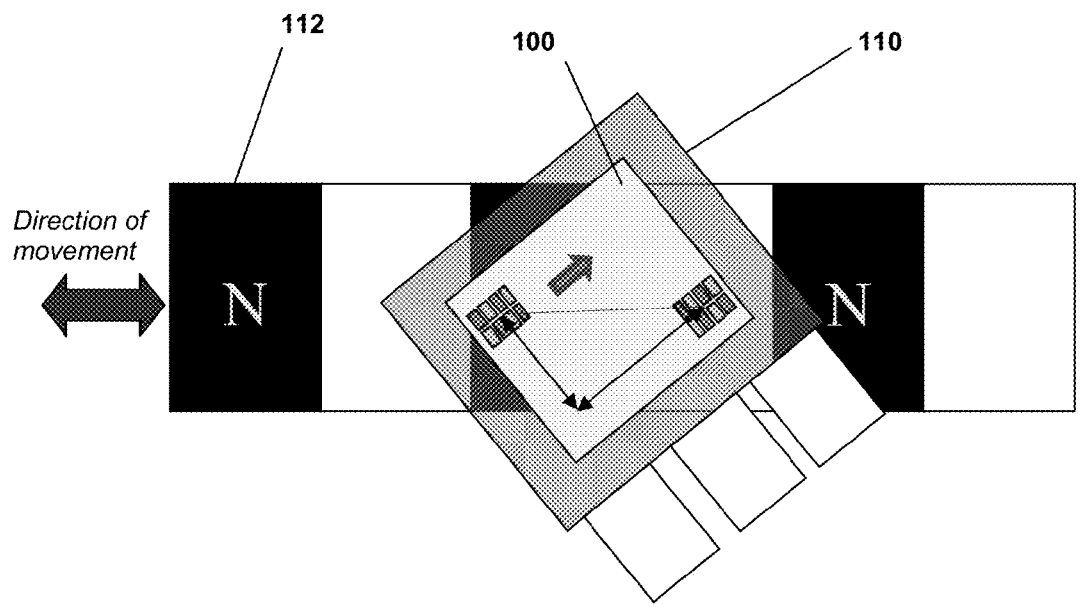
FIG. 8A depicts a sensor and pole wheel configuration according to an embodiment.
Figure 8B:
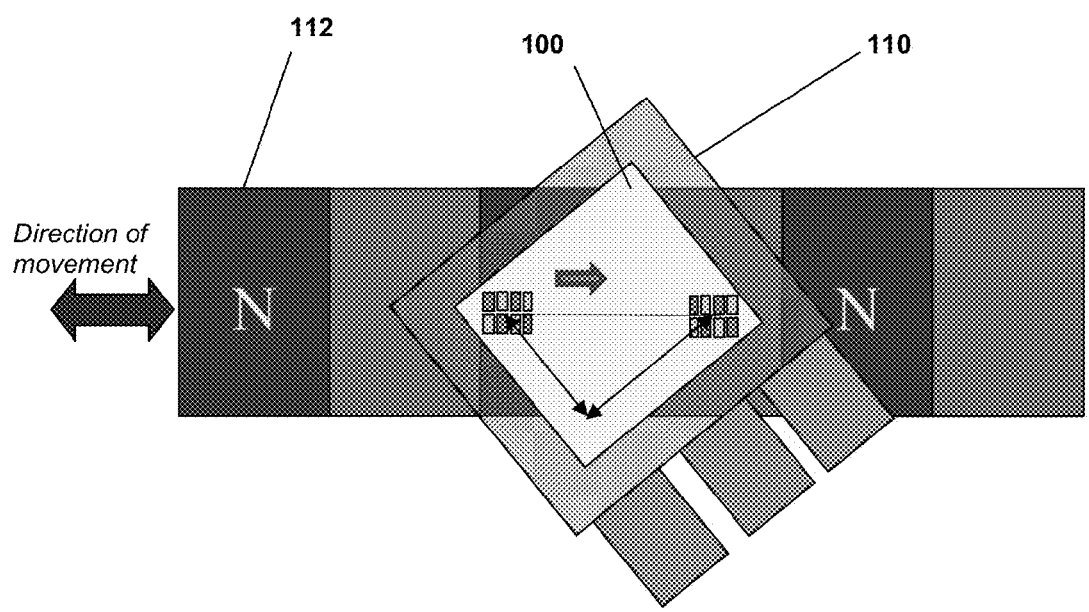
FIG. 8B depicts a sensor and pole wheel configuration according to an embodiment.

In other embodiments, die 100 can be mounted conventionally in package 110, and the entire package 110 can instead be rotated by some angle, e.g., about 22.5 or about 45 degrees or some other angle, with respect to the direction of movement of pole wheel 112. Refer, for example, to FIG. 8. In FIG. 8A, the configuration of die 100 and the premagnetization direction are as discussed in above. In FIG. 8B, the reference magnetization is parallel with the diagonal axis between the GMR resistors. The axis of the GMR resistors is aligned with the direction of rotation of pole wheel 112 while also be maximized for the die size. The configurations of FIG. 8 also be arranged similarly to as in FIG. 6, wherein die 100 is rotated within package 110.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art. Moreover, elements described with respect to one embodiment may be implemented in other embodiments even when not described in such embodiments unless otherwise noted. Although a dependent claim may refer in the claims to a specific combination with one or more other claims, other embodiments may also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A sensor comprising:
   a substrate having a length axis, a width axis and a diagonal axis in a plane defining a surface, the diagonal axis being longer than the length axis and the width axis;
   signal conditioning circuitry arranged on the surface of the substrate; and
   at least two sensor elements coupled to the signal conditioning circuitry and arranged on the substrate spaced apart from one another along the diagonal axis, the sensor configured to determine a difference in a component of a characteristic along the length axis sensed at a first of the at least two sensor elements and a component of the characteristic along the length axis at a second of the at least two sensor elements the characteristic having components along both the length axis and the width axis.

2. The sensor of claim 1, wherein the substrate is one of a rectangle or a square.

3. The sensor of claim 1, wherein the characteristic sensed by the sensor is one of a scalar characteristic or a vector field.

4. The sensor of claim 1, wherein the sensor is arranged proximate a pole wheel comprising at least three permanently magnetized segments, and a direction of rotation of the pole wheel is substantially parallel with the diagonal axis.

5. The sensor of claim 1, wherein the characteristic sensed by the sensor is a magnetic field.

6. The sensor of claim 5, wherein the at least two sensor elements comprise magnetoresistive sensor elements.

7. The sensor of claim 6, wherein the magnetoresistive sensor elements comprise giant magnetoresistive (GMR) sensor elements.

8. The sensor of claim 6, wherein the magnetoresistive sensor elements are arranged in at least one bridge configuration.

9. The sensor of claim 1, further comprising a package, wherein the substrate is arranged in the package.

10. The sensor of claim 9, wherein the diagonal axis is substantially parallel with a side of the package.

11. The sensor of claim 9, wherein the length and width axes of the substrate each are substantially parallel with sides of the package.

12. A sensor comprising:
    a substrate having four corners defining a surface having a length axis, a width axis and a diagonal axis, the diagonal axis being longer than the length axis and the width axis;
    signal conditioning circuitry arranged on the surface of the substrate; and
    at least two sensor elements coupled to the signal conditioning circuitry arranged on the substrate spaced apart from one another by at least two-thirds of the length axis and two-thirds of the width axis, the sensor configured to determine a difference in a component of a characteristic along the length axis sensed at a first of the at least two sensor elements and a component of the characteristic along the length axis at a second of the at least two sensor elements, the characteristic having components along both the length axis and the width axis.

13. The sensor of claim 12, wherein the characteristic sensed by the sensor is a magnetic field.

14. The sensor of claim 13, wherein the at least two sensor elements comprise magnetoresistive sensor elements.

15. The sensor of claim 14, wherein the magnetoresistive sensor elements comprise giant magnetoresistive (GMR) sensor elements.

16. The sensor of claim 14, wherein each of the magnetoresistive sensor elements has a reference magnetization direction that is substantially parallel with one of the length, width or diagonal axes of the substrate.

17. The sensor of claim 12, further comprising a package, wherein the substrate is arranged in the package such that the diagonal axis is substantially parallel with a side of the package.

18. The sensor of claim 12, further comprising a package, wherein the length and width axes of the substrate each are substantially parallel with sides of the package.

19. A method comprising:
    providing a substrate having at least four corners defining a surface having a length and a width;
    arranging on the substrate signal conditioning circuitry; and
    arranging on the substrate at least two sensor elements spaced apart from one another along a diagonal dimension defined between two of the four corners of the substrate;
    sensing a component of a characteristic along the length axis at a first of the at least two sensor elements and a component of the characteristic along the length axis at a second of the at least two sensor elements, the characteristic having components along both the length axis and the width axis; and
    determining a difference in the components of the characteristic sensed at the first and second of the at least two sensor elements.

20. The method of claim 19, further comprising arranging the substrate in a sensor package such that the diagonal dimension is substantially parallel with a side of the package.

21. The method of claim 19, further comprising arranging the substrate in a sensor package such that the length and the width of the substrate each are substantially parallel with sides of the package.

22. The method of claim 19, wherein the characteristic comprises a magnetic field.

23. The method of claim 22, wherein the at least two sensor elements comprise magnetoresistive sensor elements.

24. A speed sensor system comprising:
a magnetic target wheel configured to generate a field having components along both a length dimension and a width dimension of a die; and
a sensor comprising at least two sensor elements arranged proximate a diagonal dimension of the die, the die having a diagonal dimension that is greater than the length and width dimensions, the sensor further comprising a package in which the die is arranged, the sensor arranged such that a direction of rotation of the target wheel is substantially aligned with the diagonal dimension of the die, wherein the each of the at least two sensor elements are configured to determine a component of the field along the length dimension.

25. The method of claim 19, wherein arranging on the substrate at least two sensor elements spaced apart from one another by at least two-thirds of the length and two-thirds of the width further comprises arranging the at least two sensor elements spaced apart from one another by a distance greater than the length.

26. The method of claim 19, wherein arranging on the substrate at least two sensor elements spaced apart from one another by at least two-thirds of the length and two-thirds of the width further comprises arranging the at least two sensor elements spaced apart from one another by a distance that is closer to the length than the width.

27. The speed sensor system of claim 24, wherein the sensor comprises a differential sensor.

* * * * *